(12) United States Patent
Huang (10) Patent No.: US 11,155,916 B2
(45) Date of Patent: Oct. 26, 2021

(54) APPARATUS AND METHODS FOR PUMPING GASES FROM A CHAMBER

(71) Applicant: Taiwan Semiconductor Manufacturing Co., Ltd., Hsin-Chu (TW)

(72) Inventor: Fung-Chih Huang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 73 days.

(21) Appl. No.: 16/444,476

(22) Filed: Jun. 18, 2019

(65) Prior Publication Data
US 2020/0095679 A1 Mar. 26, 2020

Related U.S. Application Data

(60) Provisional application No. 62/734,423, filed on Sep. 21, 2018.

(51) Int. Cl.
| | | |
|---|---|---|
| *C23C 16/44* | (2006.01) | |
| *C09D 5/16* | (2006.01) | |
| *C23C 16/455* | (2006.01) | |

(52) U.S. Cl.
CPC ........ *C23C 16/4408* (2013.01); *C09D 5/1681* (2013.01); *C23C 16/4404* (2013.01); *C23C 16/45544* (2013.01)

(58) Field of Classification Search
CPC ............ C23C 16/4408; C23C 16/4404; C23C 16/45544; C23C 16/4412; C09D 5/1681; H01L 21/67017
USPC ....................................... 118/715; 156/345.1
See application file for complete search history.

(56) References Cited

U.S. PATENT DOCUMENTS

| | | | |
|---|---|---|---|
| 2009/0004100 A1* | 1/2009 | Umemoto | ........... C23C 16/4404 423/648.1 |
| 2012/0251721 A1 | 10/2012 | Matsumoto et al. | |
| 2017/0067153 A1* | 3/2017 | Matsuo | ............... C23C 16/4405 |
| 2018/0312969 A1* | 11/2018 | Ishii | .................. H01L 21/02123 |

FOREIGN PATENT DOCUMENTS

CN           102395705 A        3/2012

* cited by examiner

*Primary Examiner* — Rudy Zervigon
(74) *Attorney, Agent, or Firm* — Duane Morris LLP (57) ABSTRACT

Apparatus and methods for pumping gases from a chamber are disclosed. In one example, an apparatus for evacuating gases from a chemical vapor deposition (CVD) chamber is disclosed. The apparatus includes: a housing including an internal surface and at least one inlet in fluid communication with the CVD chamber; and a coating on the internal surface. The coating is configured to make the internal surface hydrophobic.

20 Claims, 7 Drawing Sheets

APPARATUS AND METHODS FOR PUMPING GASES FROM A CHAMBER

CROSS-REFERENCE TO RELATED APPLICATIONS

The present application claims priority benefit of U.S. Provisional Application No. 62/734,423, filed on Sep. 21, 2018, the contents of which are incorporated by reference in its entirety.

BACKGROUND

Semiconductor integrated circuits wafers are produced by a plurality of fabrication processes, which may include e.g. thermal oxidation, diffusion, ion implantation, rapid thermal processing (RTP), chemical vapor deposition (CVD), physical vapor deposition (PVD), epitaxy, etch, photolithography, etc. As part of a typical fabrication process, e.g. CVD process, selected gases are input to a reaction chamber for forming thin films on substrates. Such films deposit not only on the substrate, but also on the walls and other exposed surfaces of the reaction chamber. The gases are then pumped out of the reaction chamber into a pumping device, e.g. a vacuum pump. But because only a small portion of the gases input into the chamber are actually consumed in the deposition process, the gases pumped out of the chamber contain compounds that are still in highly reactive states and/or contain residues or particulate matter that can form deposits in the pump. Over time, these deposits can clog the pump and pumping lines connected thereon, interfere with normal operation of the vacuum pump, and shorten the useful life of the pump. In addition, the deposited material may move back into the chamber and contaminate wafer processing, thereby reducing wafer yield and inducing early prevention maintenance.

Existing techniques for fixing the clog problem include periodically overhauling and cleaning the pump to eliminate the deposits, e.g. using hot water and ultrasonic vibration. Such cleaning requires the wafer processing system to be shut down, thus reducing the efficiency of the reaction chamber. There is no effective solution for maintaining pumping device and pumping lines clean and clog-free.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

During wafer fabrication, gases pumped out of a reaction chamber by a pumping device contain compounds and residues, e.g. polymers, that may form deposits in the pumping device. For example, wafer processes like etching and chemical vapor deposition (CVD) can generate many polymer compounds and residues in the pumped gas. Typical polymer compounds and residues include fluoride and chloride which are likely to cause clogging of the pumping device after more and more polymers deposit in the pumping lines, inlet and/or outlet of the pumping device.

To avoid this deposition and prevent the deposition from clogging the pumping device and pumping lines connected thereon, the present teaching discloses apparatus and methods to add a hydrophobic coating in the pumping device and/or the pumping lines. This can avoid polymer deposition on the pumping device that causes pumping speed drop and polymer clogs, while minimizing or eliminating the time that the system must be shut down or taken off line for cleaning the clogs. The polymers are contained in or condensed to water/liquid particles in the pumped process gas. Many polymers are hydrophilic or have a hydrophilic end that can attach to the water/liquid particles. The hydrophobic coating will repel the water containing the residues away from staying on the inner surface of the pumping device or pumping lines, such that the residues in the water particles will be blown out of the pumping device with the gas. Even for some compounds and residues that are not hydrophilic, the hydrophobic coating can enable the water particles to flow through the pumping device and pumping lines smoothly instead of adhering on the inner surface, such that more residues can be washed out of the pumping device and pumping lines by the water particles with the pumped gas.

In one embodiment, a disclosed apparatus for pumping gases from a chamber includes a housing including an internal surface and a coating on the internal surface. The housing includes at least one inlet in fluid communication with the chamber. The coating can make the internal surface hydrophobic. For example, the coating can make the internal surface have a water contact angle larger than a predetermined threshold, e.g. 105 degrees or 120 degrees.

According to various embodiments of the present teaching, the coating is formed by a liquid state material. The material may be selected such that the coating does not chemically react with the gases pumped out of the chamber. The coating may have a thickness less than a predetermined threshold, e.g. 1 millimeter or 1 micron. In one example, a fluorinated polymer in a Hydrofluoroether (HFE) solvent may be used as the liquid state material for coating. According to various embodiments of the present teaching, the disclosed apparatus includes a plurality of turbo blades inside the housing and surrounded by the internal surface. The internal surface has a gap from the plurality of turbo blades such that the plurality of turbo blades will not damage the coating during pumping operation of the plurality of turbo blades. In one embodiment, the coating is re-formed periodically or upon a monitored warning signal, e.g. upon detecting that the coating is damaged or worn out.

An input pumping line may fluidly connect the chamber to the inlet of the pump, such that the gases are pumped out of the chamber through the input pumping line into the pump. In one embodiment, an internal surface of the input pumping line has a hydrophobic coating that may or may not be the same as the coating in the pump. An internal surface of the inlet may also have a hydrophobic coating that may or may not be the same as the coating in the pump.

An output pumping line may fluidly connect an outlet of the pump to a scrubber. In one embodiment, an internal surface of the output pumping line has a hydrophobic coating that may or may not be the same as the coating in the pump. An internal surface of the outlet may also have a hydrophobic coating that may or may not be the same as the coating in the pump.

Figure 1:
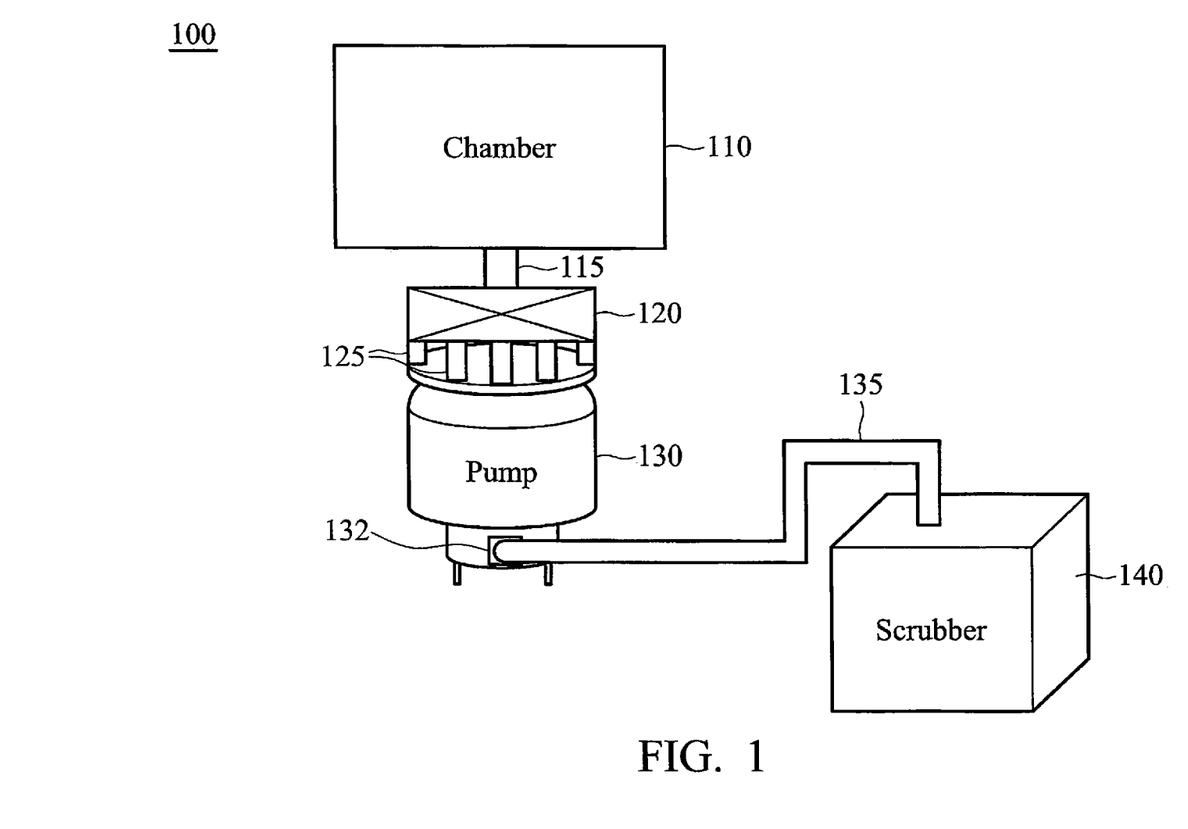
FIG. 1 illustrates a diagram of an exemplary system for processing a wafer, in accordance with some embodiments of the present disclosure.

FIG. 1 illustrates a diagram of an exemplary system 100 for processing a wafer, in accordance with some embodiments of the present disclosure. As shown in FIG. 1, the system 100 includes a reaction chamber 110, a valve 120, a pumping device 130, and a scrubber 140. The system 100 also includes an exhaust line 115 connecting the chamber 110 and the valve 120; at least one input pumping line 125 connecting the valve 120 and the pumping device 130; and an output pumping line 135 connecting the pumping device 130 and the scrubber 140. The pumping device 130, the at least one input pumping line 125 and the output pumping line 135 may be referred to collectively as a pumping system.

The chamber 110 may be a chamber for processing a semiconductor wafer, e.g. a CVD chamber, in which gases are introduced into the chamber 110 and a plasma may be formed from the gases in the chamber 110. Volatile reaction products and unreacted plasma or gas species are removed from the chamber 110 by a gas removal mechanism, such as a vacuum pump 130 through a valve 120. In a heterogeneous or surface-catalyzed reaction, the gas or plasma deposits a solid film on the surface of the wafer. By regulating the flow of gases from the interior of the chamber 110 to the vacuum pump 130, the valve 120 of the system 100 may be used to control the interior pressures of the chamber 110.

After the wafer is processed with the gases in the chamber 110, the gases are pumped out of the chamber 110 through the exhaust line 115 into the pumping device 130, under the control of the valve 120. The pumping device 130 in this example has one or more inlets each being in fluid communication with the chamber 110 through a corresponding input pumping line 125, under the control of the valve 120. The pumping device 130 also has an outlet 132 that is in fluid communication with the scrubber 140 through the output pumping line 135. The pumping device 130 pumps gases from the chamber 110 through the at least one input pumping line 125 and discharges the gases to the scrubber 140 through the output pumping line 135.

The gases pumped out of the chamber 110 contain compounds that are still in highly reactive states and/or contain residues or particulate matter that can form deposits when gas temperature drops below a certain threshold. The temperature in the chamber 110 as well as the exhaust line 115 is usually high enough to prevent the gas temperature from dropping below the temperature at which the particulate or other materials may "condense" from the conducted gas. In contrast, the temperatures in the at least one input pumping line 125, the pumping device 130 and the output pumping line 135 that are located downstream of the valve 120 are usually not high enough to prevent condensation/adhesion.

The pumping device 130 in this example has a coating formed on its internal surface. The coating makes the internal surface hydrophobic. Water does not wet hydrophobic surfaces very well and tends to "bead up" on the hydrophobic surfaces. A hydrophobic surface may be defined as a surface having a contact angle greater than a threshold, e.g. 90 degrees, with a drop of water. Hydrophobic materials include many well-known, commercially available polymers, e.g. manganese oxide polystyrene (MnO2/PS) nano-composite, zinc oxide polystyrene (ZnO/PS) nano-composite, precipitated calcium carbonate, silicon dioxide, fluoropolymer, etc. In one embodiment, the coating may be formed by applying a liquid state hydrophobic material onto internal surfaces of the pumping device 130. After the liquid state material is dried for a period of time, e.g. five minutes or an hour depending on different liquid state materials and ambient temperature, the coating is formed on the internal surface of the pumping device 130.

With the coating formed on the internal surface of the pumping device 130, the internal surface of the pumping device 130 has a hydrophobic effect that would repel liquid drops condensed from the gases passing through the pumping device 130. Each liquid drop may contain water and some polymer residue. That is, when a compound or polymer condenses from the gas into a liquid drop onto the coated internal surface, it will produce a contact angle greater than a threshold on the coated internal surface of the pumping device 130. In one embodiment, the threshold is 90 degrees. In a preferred embodiment, the threshold is 120 degrees.

As such, most or all of liquid drops condensed from the gases will be blown out of the pumping device 130 with the gases discharged through the outlet 132 of the pumping device 130, and will not deposit on the coated internal surface of the pumping device 130. According to various embodiments, the pumping device 130 includes a plurality of turbo blades (not shown in FIG. 1) inside the pumping device 130 and surrounded by the coated internal surface. The coated internal surface has a gap from the plurality of turbo blades such that the plurality of turbo blades will not damage the coating during the pumping operation of the plurality of turbo blades. The coating may have a thickness less than a threshold, e.g. 1 millimeter.

In one embodiment, the coating does not chemically react with the gases passing through the pumping device 130, such that the coating will not be corroded quickly during the wafer fabrication process. In another embodiment, the coating may be fixed or re-formed periodically or upon a monitored warning signal, e.g. upon detecting that the coating is damaged or worn out with a left thickness smaller than a threshold.

In one embodiment, a coating may also be formed on the internal surface of the at least one inlet of the pumping device 130 and/or on the internal surface of the at least one input pumping line 125. In another embodiment, a coating may also be formed on the internal surface of the outlet 132 of the pumping device 130 and/or on the internal surface of the output pumping line 135. The coatings in the pumping device 130, the at least one inlet, the at least one input pumping line 125, the outlet 132 and the output pumping line 135, may or may not be the same as each other. These coatings can reduce polymer deposition on the pumping system, and thus avoid wafer defect, early prevention maintenance and high cost induced by the polymer deposition.

The scrubber 140 in this example is fluidly connected to the outlet 132 of the pumping device 130 through the output pumping line 135. The scrubber 140 is used for the accumulation and treatment of the wafer processing residues, e.g. etching by-products. According to various embodiments, the chemical reaction formula in the chamber 110 may be e.g. $SiO_2+2(CF_4)$-->$SiF_4+2CO$, or $2Al+3Cl_2$-->$2(AlCl_3)$. That is, the wafer processing residues may include fluoride and/or chloride.

In one exemplary embodiment, the scrubber 140 may comprise a wet scrubber employing water. Thus, the scrubber 140 may combine the pumped gaseous residues and its constituents with water to produce various aqueous species that can be treated using well-known waste treatment methods. The residues and by-products may then be condensed and removed via the scrubber 140. In one embodiment, a hydrophobic coating may also be formed in the scrubber 140 to avoid too much polymer deposition and corresponding cleaning time.

Figure 2:
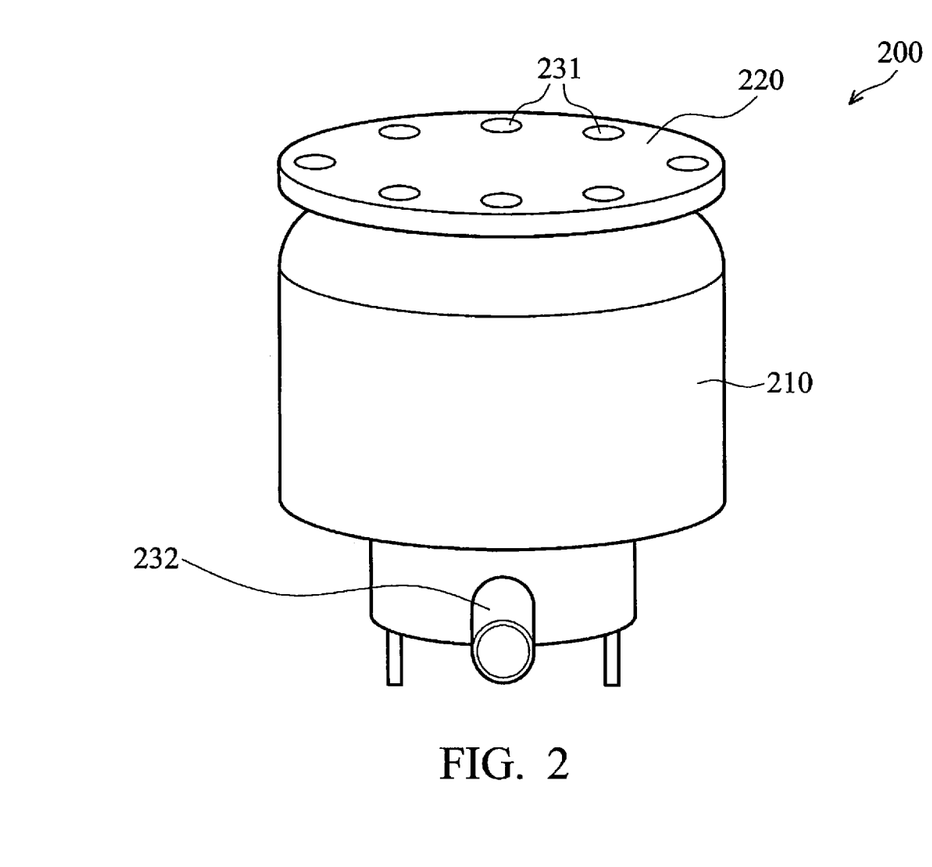
FIG. 2 illustrates an exemplary pumping device for pumping gases from a chamber, in accordance with some embodiments of the present disclosure.

FIG. 2 illustrates an exemplary pumping device 200 for pumping gases from a chamber, in accordance with some embodiments of the present disclosure. The pumping device 200 may have a same structure as that of the pumping device 130 in FIG. 1. The pumping device 200 in this example includes a housing 210 that has a top 220, at least one inlet 231 on the top 220, and an outlet 232. The at least one inlet 231 is in fluid communication with a wafer processing chamber through input pumping line(s). The outlet 232 may be in fluid communication with a scrubber through an output pumping line. The pumping device 200 can pump gases from the wafer processing chamber through the at least one inlet 231 and discharge the gases to the scrubber through the outlet 232.

As discussed above, the gases pumped out of the chamber contain compounds that are still in highly reactive states and/or contain residues or particulate matter that can form deposits when gas temperature drops below a certain threshold. To prevent deposition formed inside the housing 210, the pumping device 200 in this example has a coating formed on the internal surface of the housing 210. The coating may be formed by adding a liquid state hydrophobic material onto the internal surface of the housing 210 to make the coated internal surface hydrophobic. As such, the coated internal surface of the housing 210 has a hydrophobic effect that would repel liquid drops condensed from the gases passing through the housing 210. That is, when a compound or polymer condenses from the gas to a liquid drop onto the coated internal surface, it will produce a contact angle greater than a threshold on the coated internal surface of the housing 210. In one example, the contact angle is greater than 105 degrees. In another example, the contact angle is greater than 120 degrees. As such, most or all of liquid drops condensed from the gases will be blown out of the housing 210 with the gases discharged through the outlet 232 of the housing 210, and will not deposit on the coated internal surface of the housing 210.

A similar coating may also be formed on the internal surface of the at least one inlet 231, and/or on the internal surface of the outlet 232. These coatings can reduce deposition of condensed gases used in the pumping system, and thus avoid wafer defect, early prevention maintenance and high cost induced by the polymer deposition.

Figure 3:
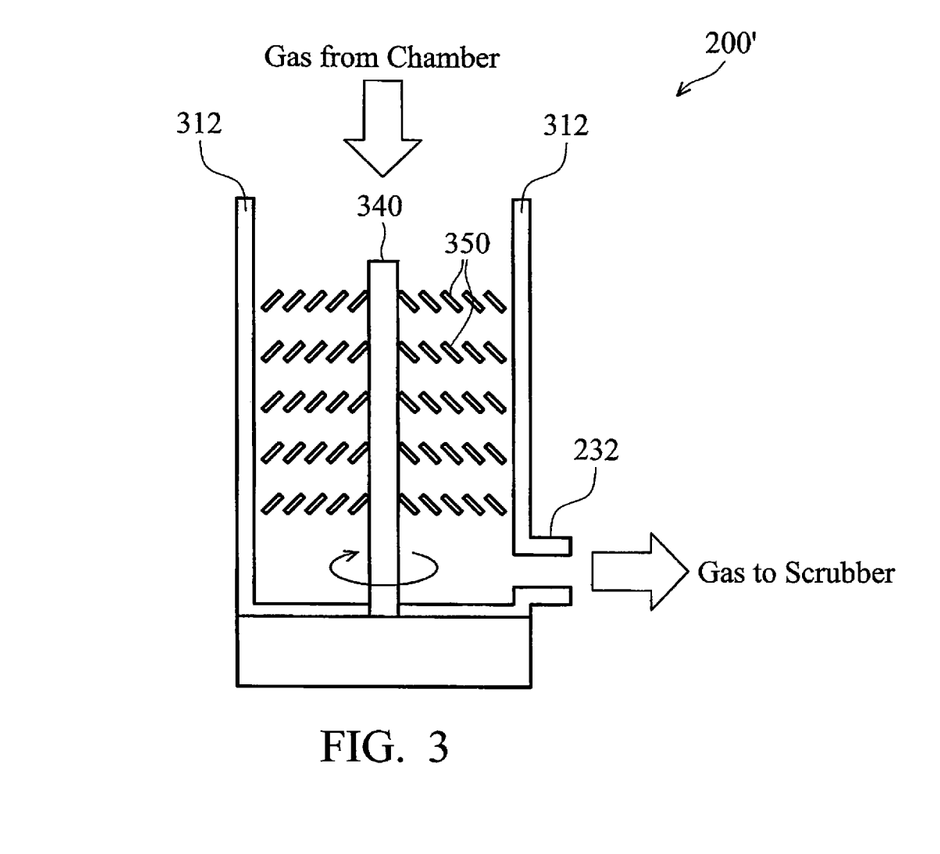
FIG. 3 shows a cross-sectional view of an exemplary pumping device for pumping gases from a chamber, in accordance with some embodiments of the present disclosure.

FIG. 3 shows a cross-sectional view of an exemplary pumping device 200' for pumping gases from a chamber, in accordance with some embodiments of the present disclosure. The pumping device 200' may have a same structure as that of the pumping device 200 in FIG. 2 and the pumping device 130 in FIG. 1. As shown in FIG. 3, the pumping device 200' in this example includes a housing 210 that has an outlet 232. Inside the housing 210, the pumping device 200' includes a coating 312 on an internal surface of the housing 210, a center pole 340, and a plurality of turbo blades 350 around the center pole 340. The pumping device 200' can pump gases from a wafer processing chamber using the plurality of turbo blades 350 and discharge the gases to a scrubber through the outlet 232.

In this example, each of the plurality of turbo blades 350 is disposed radially from the center pole 340 and substantially parallel to each other and to a bottom surface of the housing 210. The plurality of turbo blades 350 are configured to rotate around the center pole 340 in a clockwise direction or a counter-clockwise direction. The center pole 340 may be connected to a motor (not shown in FIG. 3). The motor can provide power to rotate the plurality of turbo blades 350 together in a clockwise direction or a counter-clockwise direction. The motor may also control the rotating speed of the plurality of turbo blades 350 to pump gases out of the chamber. The length of each of turbo blade 350 is long enough to generate a good pumping power for pumping the gases, but still leaves a gap between the further end of the turbo blade and the coating 312 on the internal surface of the housing 210. As such, the plurality of turbo blades 350 will not damage the coating 312 during the pumping operation of the plurality of turbo blades 350. The coating 312 enables the internal surface of the housing 210 to have a hydrophobic effect that would repel liquid drops condensed from the gases passing through the housing 210. As such, most or all of liquid drops condensed from the gases will be blown out of the housing 210 with the gases discharged through the outlet 232 to the scrubber, and will not deposit on the coated internal surface of the housing 210. The coating may have a thickness less than a threshold, e.g. 1 millimeter, and may be fixed or re-formed periodically or upon a monitored warning signal, e.g. upon detecting that the coating is damaged or worn out with a left thickness smaller than a threshold. This will increase the useful life of the pumping system. In accordance with various embodiments, the coating 312 may comprise any fluoride chemical liquid, e.g. a fluorinated polymer in a Hydrofluoroether (HFE) solvent.

Figure 4:
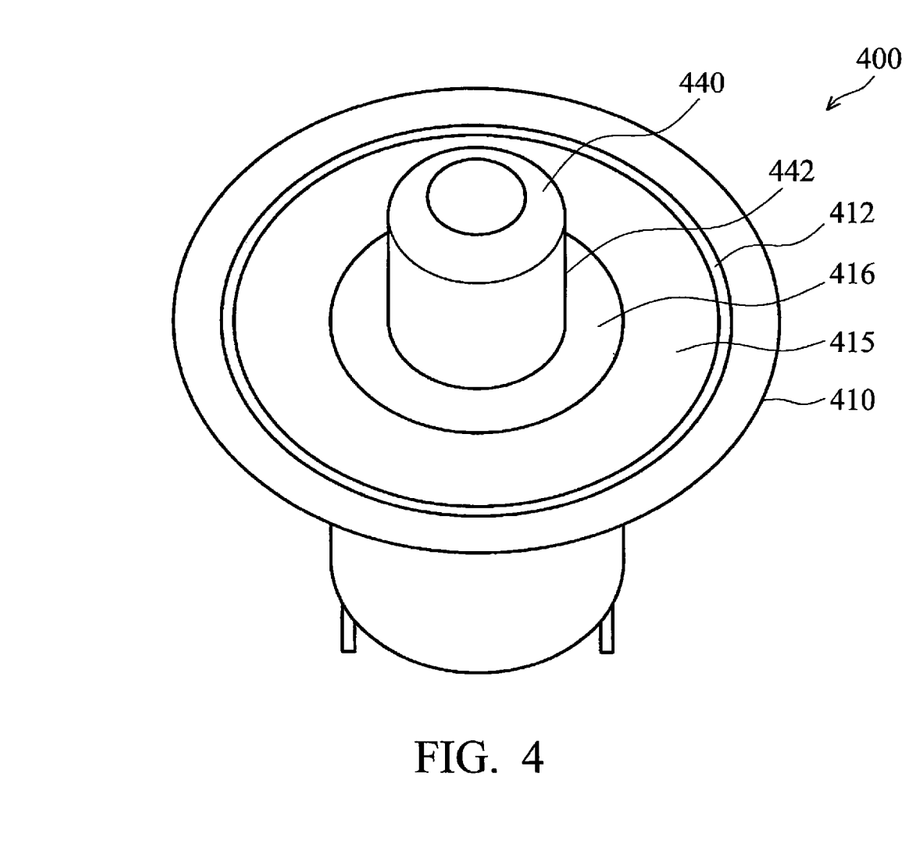
FIG. 4 shows a perspective view of a bottom portion of an exemplary pumping device for pumping gases from a chamber, in accordance with some embodiments of the present disclosure.

FIG. 4 shows a perspective view of a bottom portion of an exemplary pumping device 400 for pumping gases from a chamber, in accordance with some embodiments of the present disclosure. The pumping device 400 may have a same structure as that of the pumping devices shown in FIGS. 1-3. As shown in FIG. 4, the bottom portion of the pumping device 400 in this example includes a housing 410 that has an internal surface 415 and a bottom surface 416. Inside the housing 410, the pumping device 400 includes a coating 412 on the internal surface 415 and a center pole 440. The pumping device 400 can pump gases from a wafer processing chamber using a plurality of turbo blades (not shown in FIG. 4) around the center pole 440 and discharge the gases to a scrubber via an outlet.

As discussed above, the gases pumped out of the chamber contain compounds that are still in highly reactive states and/or contain residues or particulate matter that can form deposits inside the housing 410, without the coating 412. To prevent deposition formed inside the housing 410, the coating 412 is formed on the internal surface 415 of the housing 410. The coated internal surface 415 of the housing 410 has a hydrophobic effect that would repel liquid drops condensed from the gases passing through the housing 410. As such, most or all of liquid drops condensed from the gases will be blown out of the housing 410 with the gases discharged out of the outlet of the housing 410, and will not deposit on the coated internal surface 415 of the housing 410. A similar hydrophobic coating may also be formed on the bottom surface 416 and/or on an outer surface 442 of the center pole 440. In addition, a similar hydrophobic coating may also be formed on a top surface (not shown in FIG. 4) of the pumping device 400. These coatings can reduce deposition of the gas residues inside the pumping device 400, and thus avoid wafer defect, early prevention maintenance and high cost induced by the deposition. In general, the entire inside surface of the 400 that can be in physical contact with the gases pumped out of the chamber may be covered by a hydrophobic coating.

Figure 5:
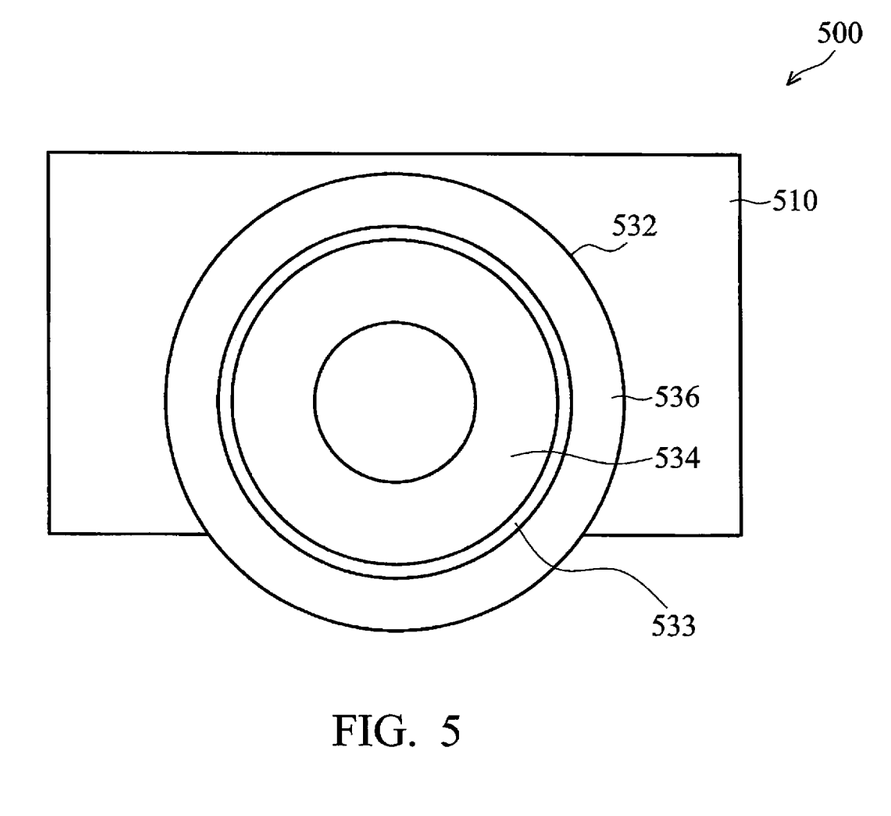
FIG. 5 illustrates an outlet of an exemplary pumping device for pumping gases from a chamber, in accordance with some embodiments of the present disclosure.

FIG. 5 illustrates an outlet 532 of an exemplary pumping device 500 for pumping gases from a chamber, in accordance with some embodiments of the present disclosure. The pumping device 500 may have a same structure as that of the pumping devices shown in FIGS. 1-4. As shown in FIG. 5, the pumping device 500 in this example includes a housing 510 that has an outlet 532. The pumping device 500 can pump gases from a wafer processing chamber and discharge the gases to a scrubber via the outlet 532.

The outlet 532 in this example includes an internal surface 534, a coating 533 formed on the internal surface 534, and an interface 536. The interface 536 may be connected to an output pumping line that can direct gases from the pumping device 500 to a scrubber for collection and treatment of the gaseous wafer processing residues. The gaseous wafer processing residues pumped out of the chamber and directed to the scrubber can form deposits on the internal surface 534 of the outlet 532, without the coating 533. To prevent deposition formed inside the outlet 532, the coating 533 is formed on the internal surface 534 of the outlet 532, such that the coated internal surface 534 of the outlet 532 has a hydrophobic effect that would repel liquid drops condensed from the gases passing through the outlet 532. As such, most or all of liquid drops condensed from the gases will be blown through the outlet 532 with the gases discharged out of the outlet 532 of the housing 510, and will not deposit on the coated internal surface 534 of the outlet 532, thus avoiding wafer defect, early prevention maintenance and high cost induced by the deposition.

Figure 6:
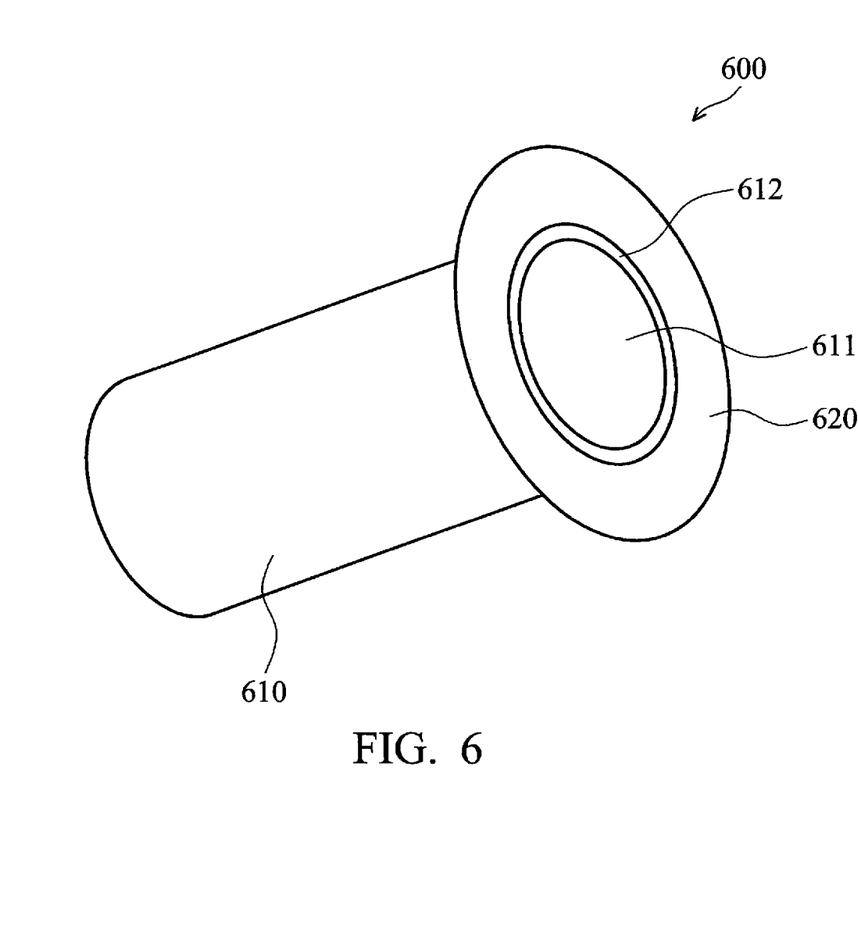
FIG. 6 illustrates a pumping line of an exemplary pumping device for pumping gases from a chamber, in accordance with some embodiments of the present disclosure.

FIG. 6 illustrates a pumping line 600 of an exemplary pumping device for pumping gases from a chamber, in accordance with some embodiments of the present disclosure. The pumping device connected to the pumping line 600 may have a same structure as that of the pumping devices shown in FIGS. 1-5. As shown in FIG. 6, the pumping line 600 in this example includes a pipe 610, an interface 620, and a coating 612 formed on an internal surface 611 of the pipe 610.

In one embodiment, the pumping line 600 serves as an input pumping line connecting a chamber with a pumping device, where the interface 620 is connected to an inlet of the pumping device or a valve controlling the gas pumping. In another embodiment, the pumping line 600 serves as an output pumping line connecting a pumping device with a scrubber for collection and treatment of the gaseous wafer processing residues, where the interface 620 is connected to an outlet of the pumping device or an inlet of the scrubber. In either case, gases pumped out of the wafer processing chamber pass through the pipe 610. The gaseous wafer processing residues pumped out of the chamber and directed to the scrubber can form deposits on the internal surface 611 of the pipe 610, without the coating 612. To prevent deposition formed inside the pipe 610, the coating 612 is formed on the internal surface 611 of the pipe 610, such that the coated internal surface 611 of the pipe 610 has a hydrophobic effect that would repel liquid drops condensed from the gases passing through the pipe 610. As such, most or all of liquid drops condensed from the gases will be blown with the gases through and out of the pipe 610, and will not deposit on the coated internal surface 611 of the pipe 610, thus avoiding wafer defect, early prevention maintenance and high cost induced by the polymer deposition.

Figure 7:
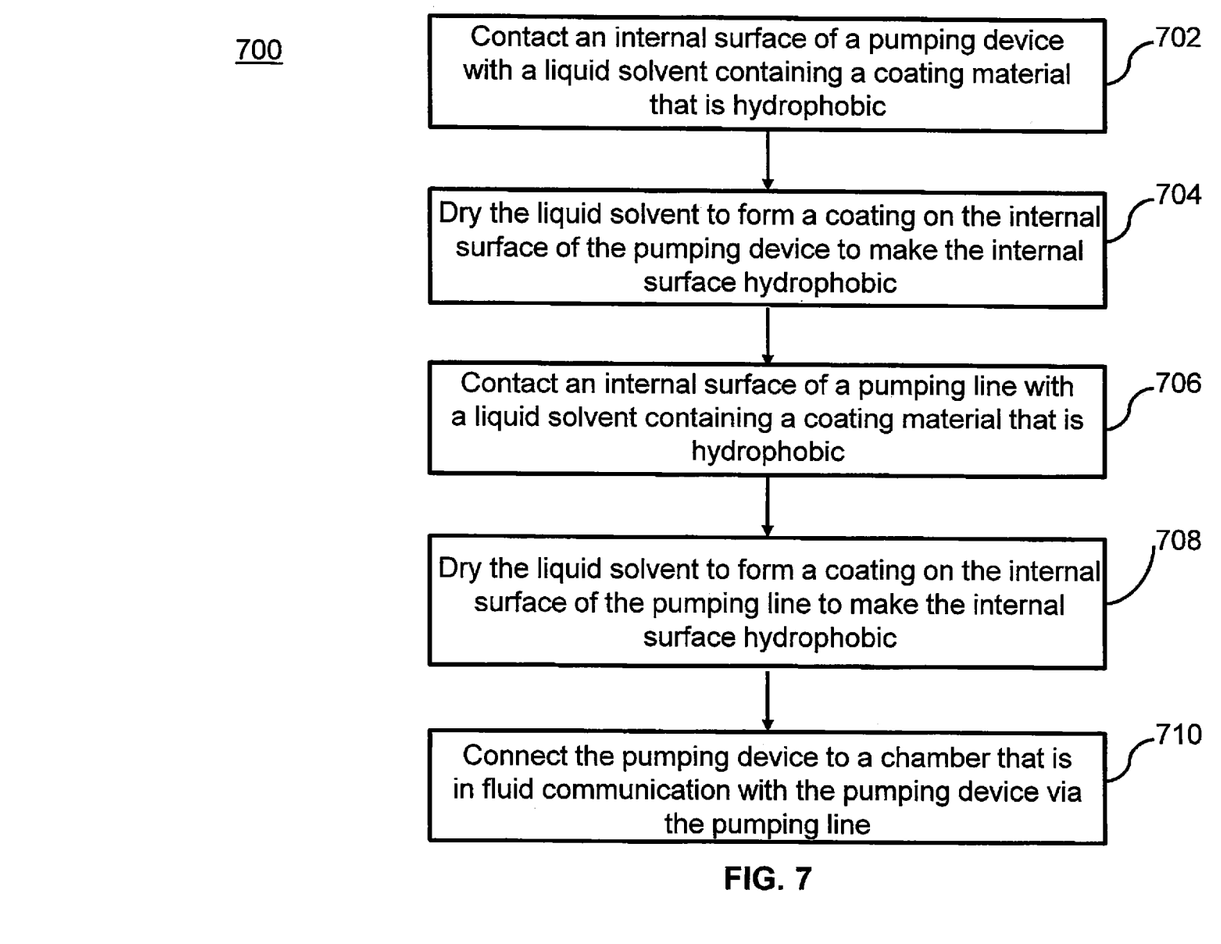
FIG. 7 is a flow chart illustrating an exemplary method for processing wafers in a chamber and pumping gases from the chamber, in accordance with some embodiments of the present disclosure.

FIG. 7 is a flow chart illustrating an exemplary method 700 for processing wafers in a chamber and pumping gases from the chamber, in accordance with some embodiments of the present disclosure. As shown in FIG. 7, an internal surface of a pumping device is contacted at operation 702 with a liquid solvent containing a coating material that is hydrophobic. At operation 704, the liquid solvent is dried to form a coating on the internal surface of the pumping device to make the internal surface of the pumping device hydrophobic. At operation 706, an internal surface of a pumping line is contacted with a liquid solvent containing a coating material that is hydrophobic. At operation 708, the liquid solvent is dried to form a coating on the internal surface of the pumping line to make the internal surface of the pumping line hydrophobic. At operation 710, the pumping device is connected to a chamber that is in fluid communication with the pumping device via the pumping line. The order of the operations shown in FIG. 7 may be changed according to different embodiments of the present disclosure.

In an embodiment, an apparatus for evacuating gases from a chemical vapor deposition (CVD) chamber is disclosed. The apparatus includes: a housing including an internal surface and at least one inlet in fluid communication with the CVD chamber; and a coating on the internal surface. The coating is configured to make the internal surface hydrophobic.

In another embodiment, an apparatus is disclosed. The apparatus includes: a chamber configured to process a wafer with processing gases; and a pumping device. The pumping device that comprises: a housing including an internal surface and at least one inlet in fluid communication with the chamber, and a coating on the internal surface. The coating is configured to make the internal surface hydrophobic.

In yet another embodiment, a method is disclosed. The method includes: contacting an internal surface of a pumping device with a first liquid solvent containing a first coating material that is hydrophobic; drying the first liquid solvent to form a first coating on the internal surface of the pumping device; contacting an internal surface of a pumping line with a second liquid solvent containing a second coating material that is hydrophobic; drying the second liquid solvent to form a second coating on the internal surface of the pumping device; and connect the pumping device to a wafer processing chamber that is in fluid communication with the pumping device via the pumping line.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for evacuating and treating gases from a chemical vapor deposition (CVD) chamber, comprising:
   a housing including an internal surface of the housing, a vacuum pump and at least one inlet in fluid communication with the CVD chamber;
   a scrubber including an internal surface of the scrubber and at least one inlet in fluid communication with the housing; and
   a coating on the internal surfaces of the housing and the scrubber, wherein the coating is configured to make the internal surfaces hydrophobic,
   wherein the hydrophobic coating is formed by applying a liquid state hydrophobic material onto internal surfaces of the housing and the scrubber, and allowing the liquid state hydrophobic material to dry for a predetermined amount of time so as to provide a hydrophobic coating with a water contact angle greater than 120 degrees.

2. The apparatus of claim 1, wherein the hydrophobic coating has a thickness less than 1 millimeter.

3. The apparatus of claim 1, wherein the hydrophobic coating does not chemically react with the gases from the CVD chamber.

4. The apparatus of claim 1, further comprising:
   a plurality of turbo blades inside the housing and surrounded by the internal surface of the housing, wherein the internal surface of the housing has a gap from the plurality of turbo blades such that the plurality of turbo blades will not damage the hydrophobic coating during pumping operation of the plurality of turbo blades.

5. The apparatus of claim 1, further comprising an input pumping line fluidly connecting the CVD chamber to the at least one inlet, wherein:
   the gases are pumped out of the chamber through the input pumping line;
   an internal surface of the input pumping line has a second coating that is configured to make the internal surface of the input pumping line hydrophobic; and
   an internal surface of the at least one inlet has a third coating that is configured to make the internal surface of the at least one inlet hydrophobic.

6. The apparatus of claim 1, further comprising an output pumping line fluidly connecting an outlet of the housing to the scrubber, wherein:
   an internal surface of the output pumping line has a fourth coating that is configured to make the internal surface of the output pumping line hydrophobic; and
   an internal surface of the outlet has a fifth coating that is configured to make the internal surface of the outlet hydrophobic.

7. The apparatus of claim 1, wherein the hydrophobic coating has a thickness less than 1 micron.

8. An apparatus, comprising:
   a chamber configured to process a wafer with processing gases;
   a pumping device that comprises a housing including an internal surface of the housing and at least one inlet in fluid communication with the chamber;
   a scrubber that comprises an internal surface of the scrubber and at least one inlet in fluid communication with the pumping device; and
   a coating on the internal surfaces of the housing and the scrubber, wherein the coating is configured to make the internal surfaces hydrophobic,
   wherein the hydrophobic coating is formed by applying a liquid state hydrophobic material onto internal surfaces of the housing and the scrubber, and allowing the liquid state hydrophobic material to dry for a predetermined amount of time so as to provide a hydrophobic coating with a water contact angle greater than 120 degrees.

9. The apparatus of claim 8, wherein the hydrophobic coating has a thickness less than 1 micron.

10. The apparatus of claim 8, wherein the liquid state hydrophobic material comprises a coating material in a liquid solvent.

11. The apparatus of claim 10, wherein the coating material comprises a fluorinated polymer that does not chemically react with the processing gases from the chamber.

12. The apparatus of claim 8, wherein the chamber is configured to perform an etching process on the wafer.

13. The apparatus of claim 8, wherein the processing gases include fluoride residues.

14. The apparatus of claim 8, wherein the processing gases include chloride residues.

15. A system for processing a wafer comprising:
   a reaction chamber;

a valve;

at least one input pumping lines;

a vacuum pump; and a scrubber, wherein a hydrophobic coating is formed by applying a liquid state hydrophobic material onto internal surfaces of the vacuum pump and the scrubber, and allowing the liquid state hydrophobic material to dry for a predetermined amount of time so as to provide a hydrophobic coating with a water contact angle greater than 120 degrees.

16. The system of claim 15, wherein the hydrophobic coating has a thickness less than 1 millimeter.

17. The system of claim 15, wherein the hydrophobic coating has a thickness less than 1 micron.

18. The system of claim 15, wherein the reaction chamber is configured to perform an etching process on the wafer.

19. The system of claim 15, wherein the hydrophobic coating does not chemically react with gases from the reaction chamber.

20. The apparatus of claim 15, wherein processing gases within the reaction chamber include fluoride residues.

\* \* \* \* \*